(12) United States Patent
Yamagishi et al.

(10) Patent No.: US 8,909,854 B2
(45) Date of Patent: Dec. 9, 2014

(54) MEMORY DEVICE WITH SPECIFIED WRITE DATA SIZE

(75) Inventors: Osamu Yamagishi, Tokyo (JP); Atsushi Shiraishi, Kawasaki (JP); Misao Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 13/424,749

(22) Filed: Mar. 20, 2012

(65) Prior Publication Data
US 2013/0073793 A1    Mar. 21, 2013

(30) Foreign Application Priority Data

Sep. 16, 2011  (JP) ................................. 2011-203777
Feb. 7, 2012   (JP) ................................. 2012-024188

(51) Int. Cl.
*G06F 12/00*    (2006.01)
*G11C 16/00*    (2006.01)
*G06F 13/16*    (2006.01)

(52) U.S. Cl.
CPC ............... *G06F 13/16* (2013.01); *G11C 16/00* (2013.01)
USPC ........... 711/103; 711/100; 711/156; 711/170; 711/173; 714/52

(58) Field of Classification Search
None
See application file for complete search history.

(56) References Cited

U.S. PATENT DOCUMENTS

| 7,926,720 | B2 | 4/2011 | Elhamias et al. | |
| 2009/0216937 | A1* | 8/2009 | Yasufuku | 711/103 |
| 2010/0011158 | A1 | 1/2010 | Shiraishi et al. | |

FOREIGN PATENT DOCUMENTS

JP     2003-203490     7/2003

OTHER PUBLICATIONS

Jedec Standard, "Universal Flash Storage (UFS)", JESD220, Jedec Solid State Technology Association, Feb. 2011, 260 pages.

* cited by examiner

*Primary Examiner* — Shawn X Gu
(74) *Attorney, Agent, or Firm* — Oblon, Spivak, McClelland, Maier & Neustadt, L.L.P.

(57) ABSTRACT

According to one embodiment, a memory device includes a nonvolatile memory which stores data in units of a write unit includes cells, and a controller which controls the memory and partitions memory space of the memory. In response to a request to write write-data to the memory from a host, the controller requests the host to transmit a segment of the write-data with a specified size. The write-data segment has a size of an integral multiple of a size determined to allow for a set of the write-data segment and corresponding additional data to be the largest while smaller than the write unit. Before completion of processing a first command which requests access to a first partition, the controller accepts a second command which requests access to a second partition.

16 Claims, 12 Drawing Sheets

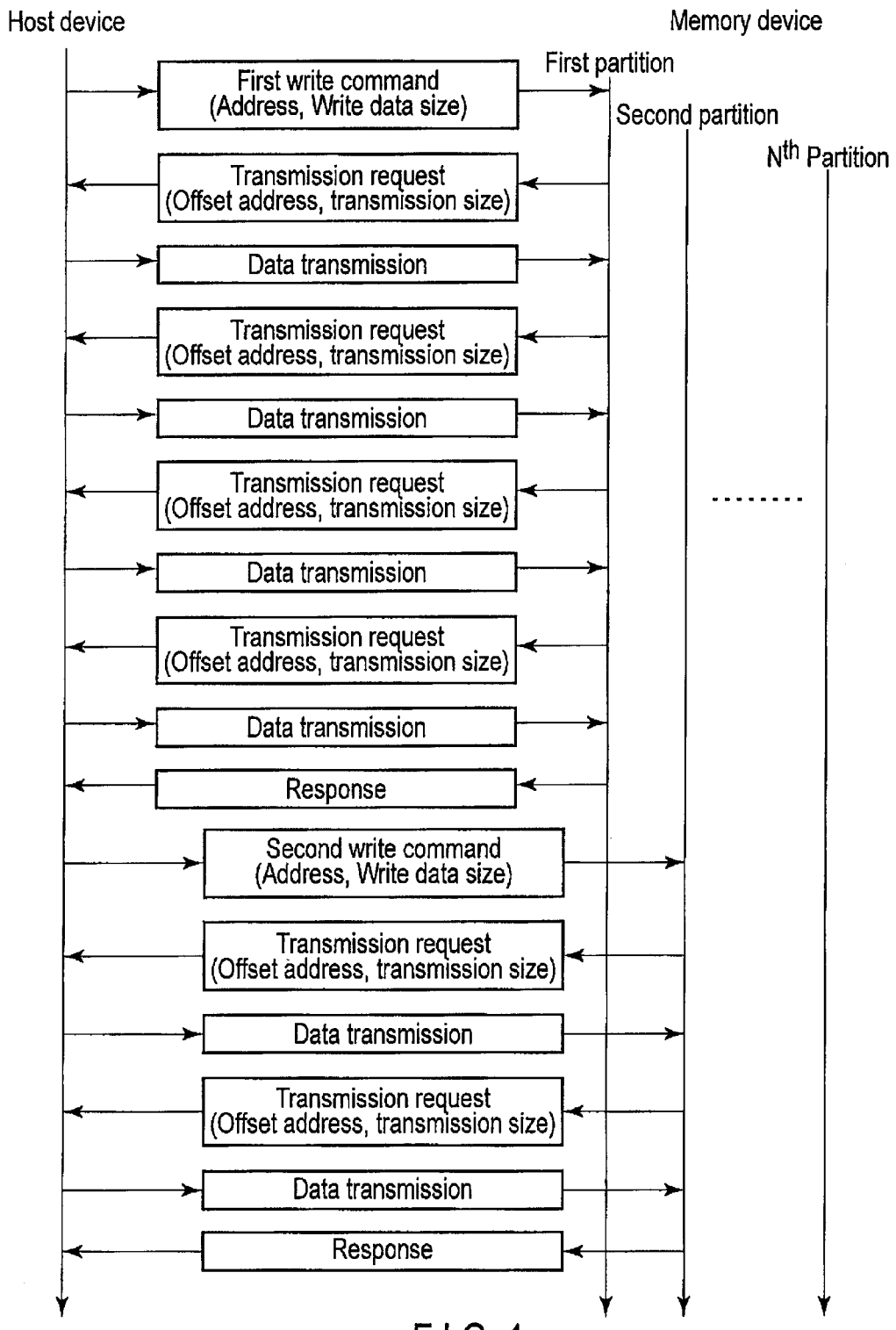
F I G. 1

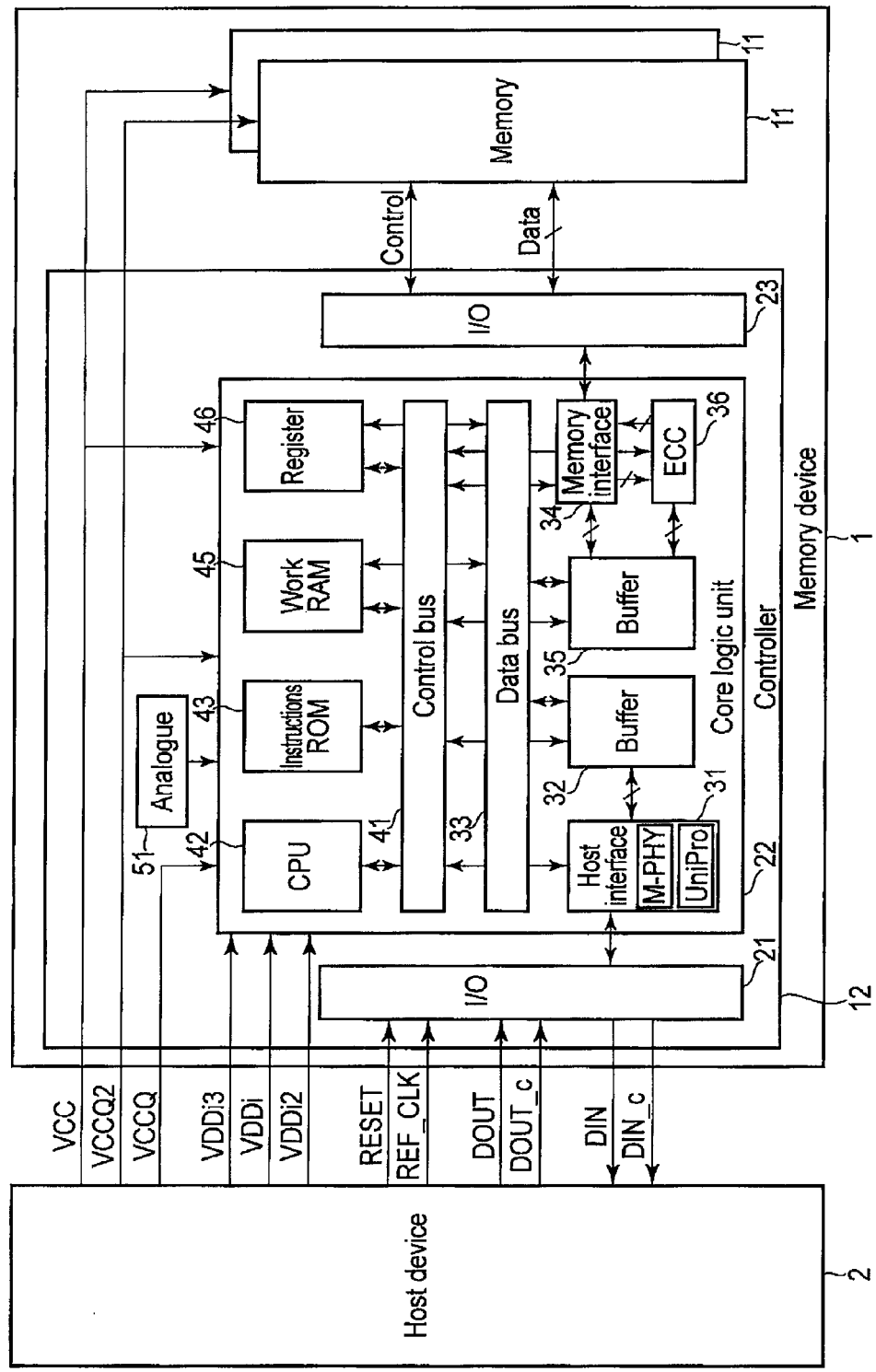
F I G. 2

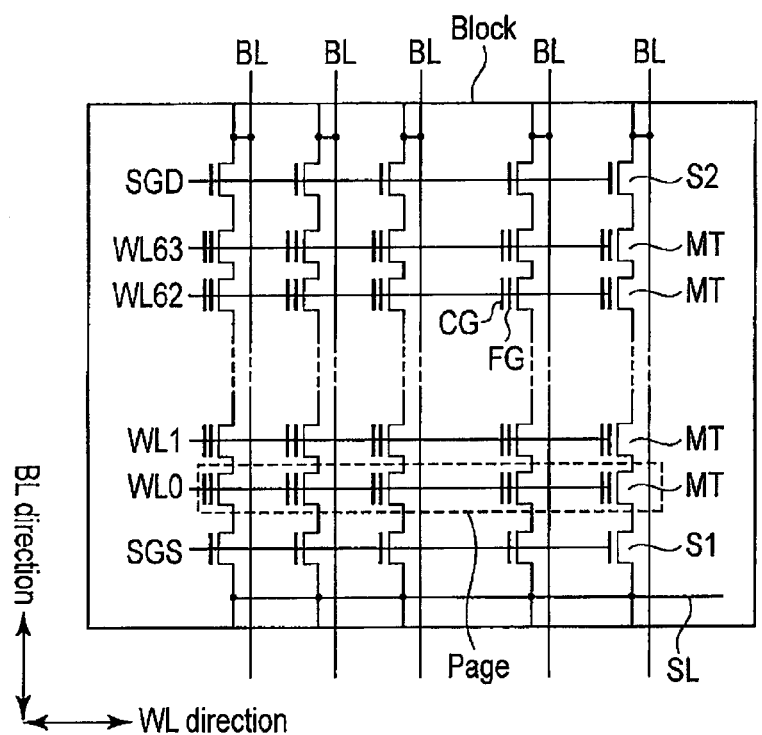
F I G. 3
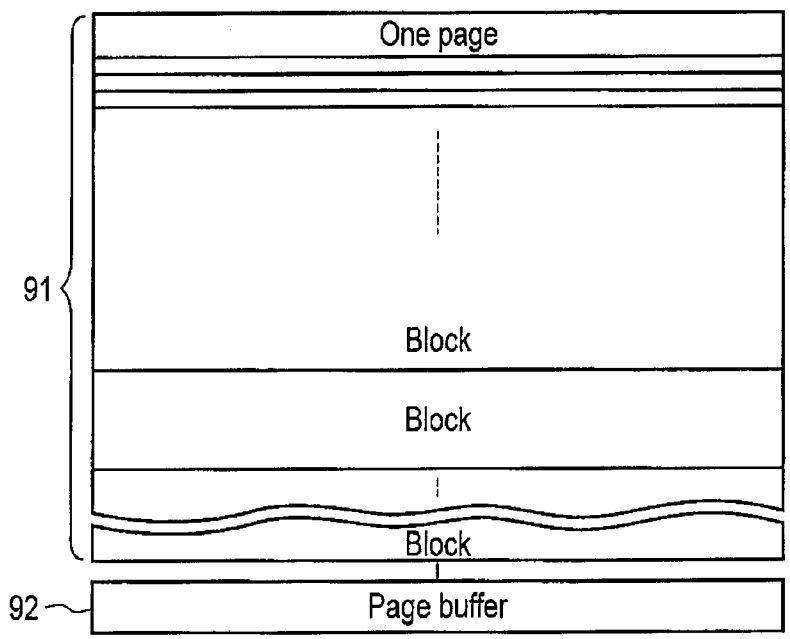
F I G. 4

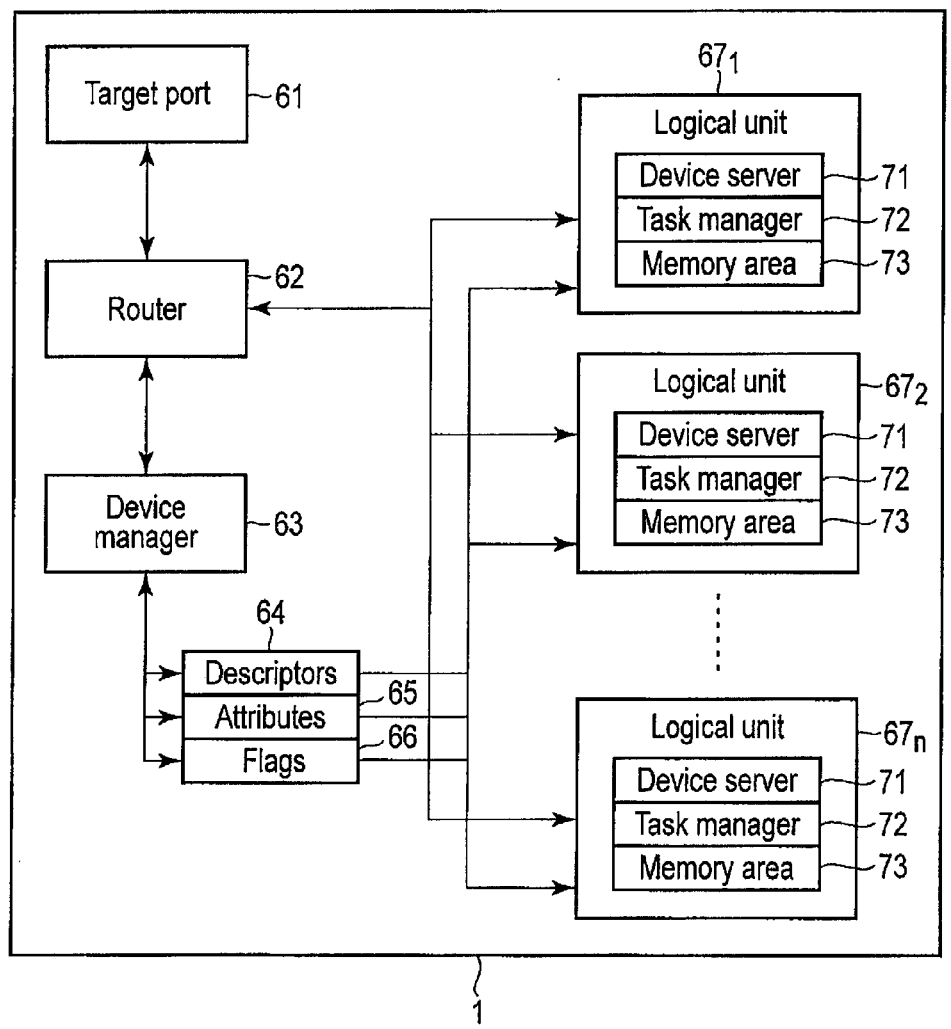
F I G. 6

| Logical address | Physical (block) address |
|---|---|
| 0x0000_0x0FFF | 0x0001 |
| 0x1000_0x1FFF | 0x0005 |
| 0x2000_0x2FFF | 0x0100 |
| 0x3000_0x3FFF | 0x0A00 |
| 0x4000_0x4FFF | 0x0003 |
| 0x5000_0x5FFF | 0x0123 |
| ... | ... |

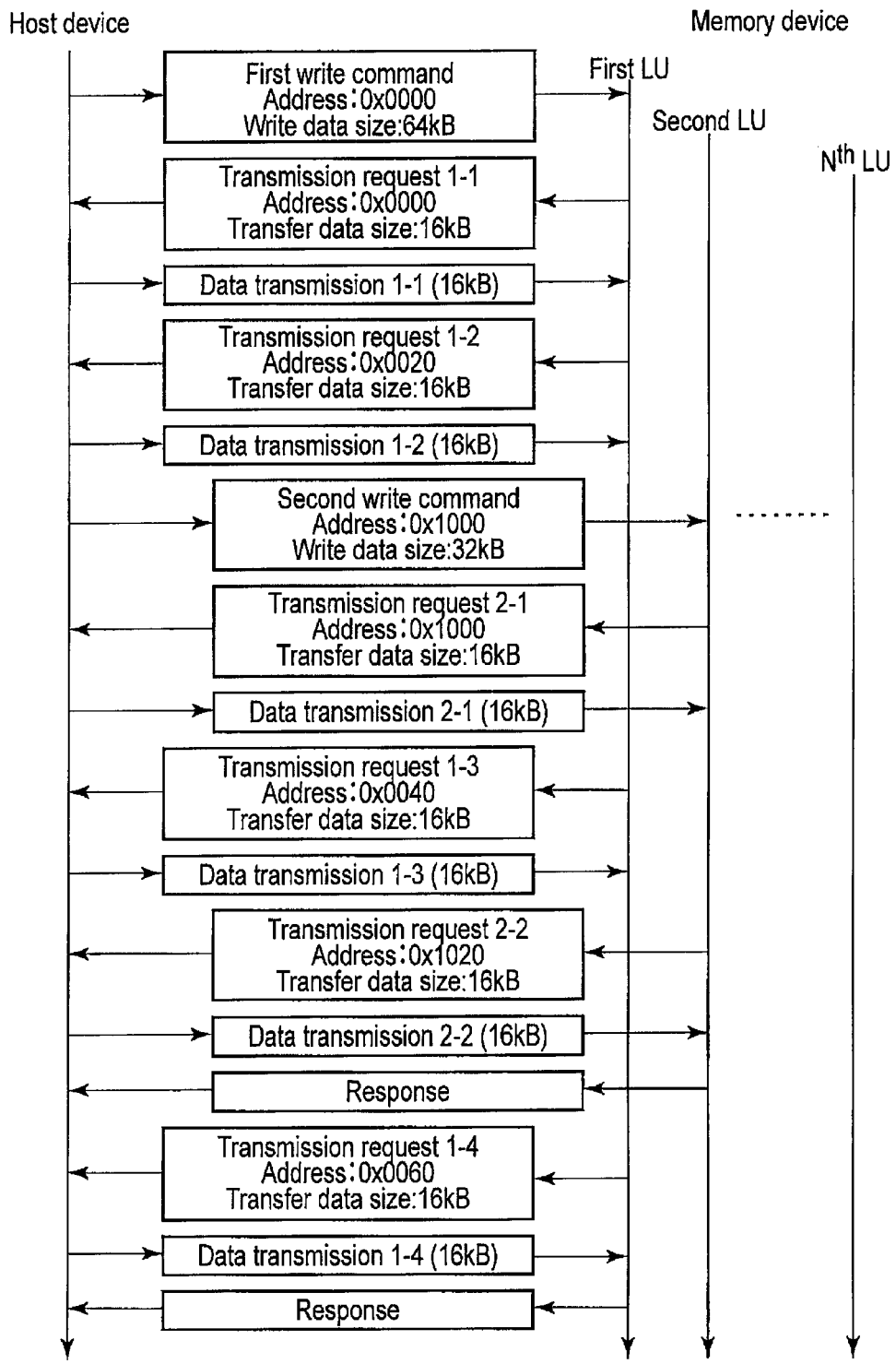
F I G. 10

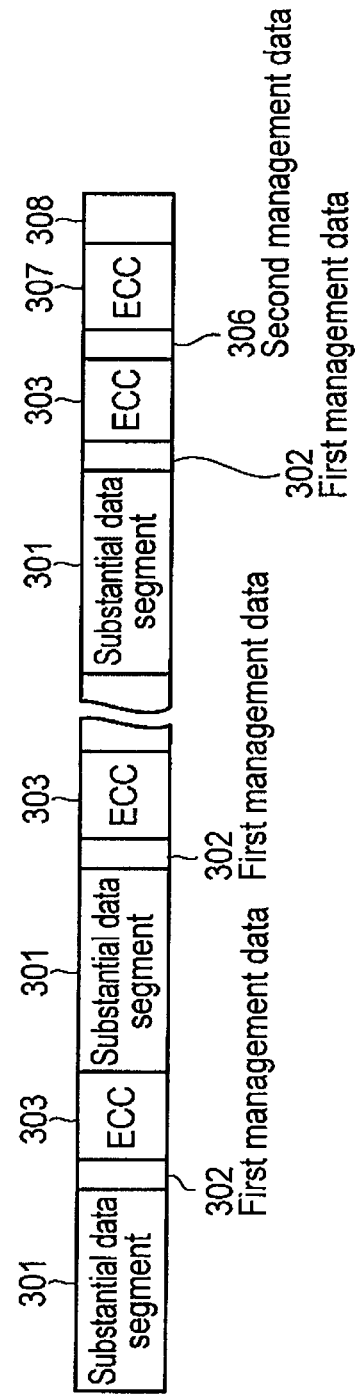
F I G. 14

MEMORY DEVICE WITH SPECIFIED WRITE DATA SIZE

CROSS-REFERENCE TO RELATED APPLICATIONS

This application is based upon and claims the benefit of priority from prior Japanese Patent Applications No. 2011-203777, filed Sep. 16, 2011; and No. 2012-024188, filed Feb. 7, 2012, the entire contents of all of which are incorporated herein by reference.

FIELD

Embodiments described herein relate generally to a memory device.

BACKGROUND

There are many kinds of media for storing data. One such medium is a memory device based on a client/server model. A memory system which includes a memory device and a host device based on the client/server model differs from another memory system in several regards. For example, roles assumed by the memory device and the host device based on the client/server model are different from those based on a non-client/server model. Therefore, transmissions between the host device and the memory device also differ between the client/server-model system and another system.

A memory system may need to comply with a specific standard. One of memory systems based on the client/server model may include a universal flash storage (UFS) memory device and its host device. Respects defined by a standard need to be satisfied. There are, however, also regards not defined by the standard and a designer of the memory system can determine them. Such flexible matters should be determined to realize desirable performance with characteristics suitable for the memory system. There are demands for a memory device with increased performance with such flexible design matters properly determined.

BRIEF DESCRIPTION OF THE DRAWINGS

FIG. 1 illustrates communications in an example memory system for reference.

FIG. 2 illustrates a hardware configuration of a memory device according to a first embodiment.

FIG. 3 illustrates a circuit diagram of a memory.

FIG. 4 illustrates a structure of memory space.

FIG. 6 illustrates functional blocks of the memory device according to the first embodiment.

FIG. 10 illustrates communications during writing according to the first embodiment.

FIG. 14 illustrates contents of data in a page according to the first embodiment.

DETAILED DESCRIPTION

Figure 5:
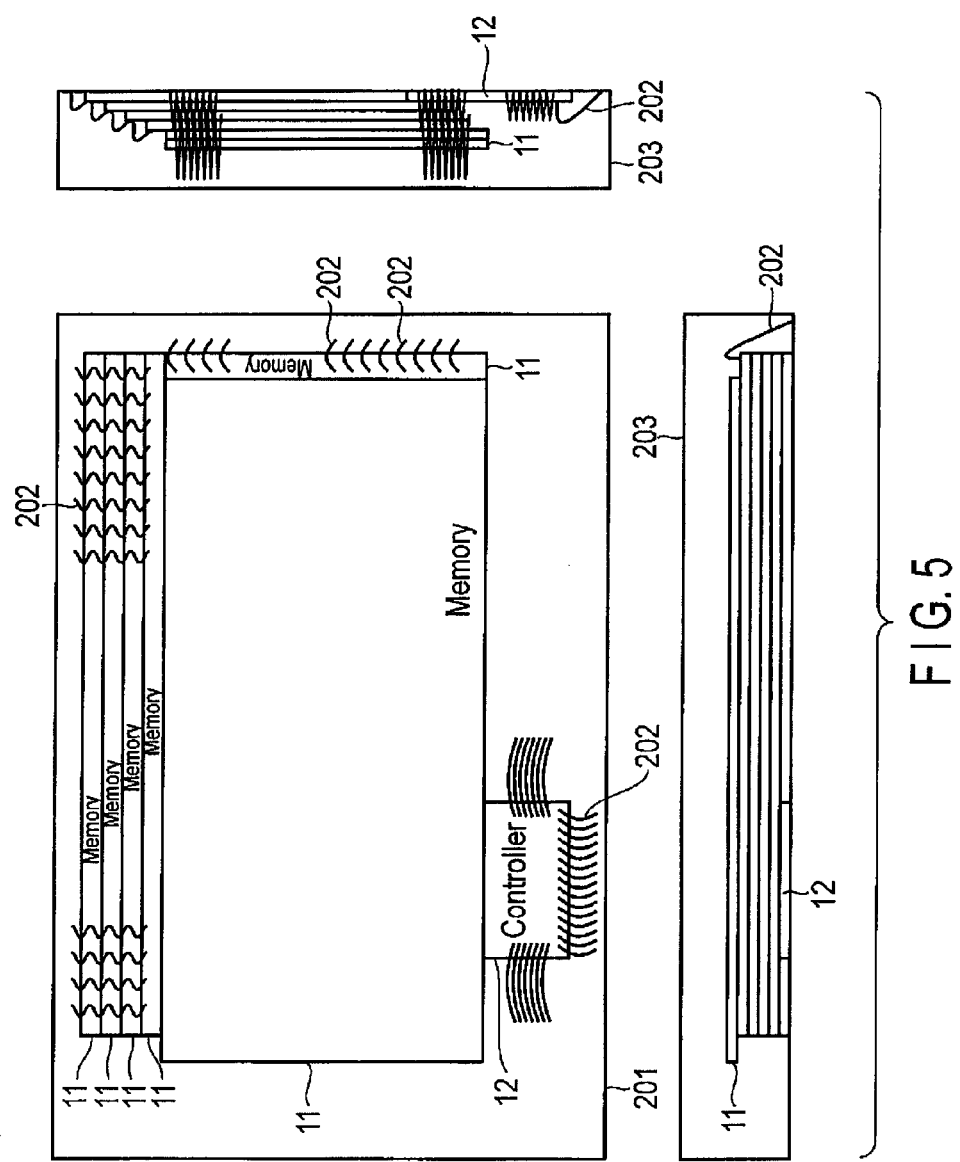
FIG. 5 illustrates an example configuration of a sealed memory device.

In general, according to one embodiment, a memory device includes a nonvolatile memory which stores data in units of a write unit comprising cells, and a controller which controls the memory. The controller partitions memory space of the memory. In response to a request to write data to the memory from a host device, the controller requests the host device to transmit a segment of the write-data with a specified size. The write-data segment has a size of an integral multiple of a size determined to allow for a set of the write-data segment and corresponding additional data to be the largest while smaller than the write unit. Before completion of processing a first command which requests access to a first partition, the controller accepts a second command which requests access to a second partition.

Prior to describing embodiments, an example memory system based on the client/server model will be briefly described for reference. Two or more partitions may be defined in a memory device based on the client/server model.

FIG. 1 illustrates communications between such a memory device and its host device during writing. As shown in FIG. 1, the host device issues a write command to start writing. A write command includes information on the logical address of data to be written (write data) and its size. This write command instructs writing to, e.g., partition 1 of the memory device. The memory device generates transmission requests for the write data when it receives the write command. A transmission request is supposed to include the size and an offset address of a segment of write data which the memory device requires the host device to transmit. The offset address specifies the position of the segment which the memory device requests to be transmitted. Upon reception of the transmission request, the host device transmits the requested data segment to the memory device. The memory device then writes the received data segment to its memory and sends another transmission request for a further data segment. Such a set of transmission request and writing is repeated until the whole write data is written. The memory device transmits a response to the host device based on a success or failure of the writing of the whole write data.

The memory device does not accept writing to a partition before issue of the response after reception of another write command for another partition. For this reason, the host device which desires writing to a partition other than the partition 1 issues a write command for writing to another partition such as a partition 2 after completion of the writing to the partition 1. In response to such a write command, the host device and the memory device write the data to the partition 2 by the same steps as above.

An eMMC device is known as such a memory device which prohibits writing to a partition before issue of a response after a write command for another partition.

In contrast, there is a memory device which accepts parallel access to partitions and a corresponding host device. One example of such a memory system may be a system of a UFS memory device and a host device. The standard of the UFS only specifies that the memory device and the host device must support parallel access to partitions but does not define details of such access. For this reason, undefined matters need to be determined appropriately with the nature of the memory system considered.

Embodiments configured in accordance with such background will now be described with reference to drawings.

Components which have substantially the same function and a configuration have the same reference number, and duplicate description is given only when required, in the following description. Embodiment described below illustrates devices and methods for embodying technical idea of embodiments. The technical idea of embodiments does not limit details to the following examples. The technical idea of the embodiments may be variously changed in accordance with the scope of the claims.

(First Embodiment)

FIG. 2 schematically illustrates a memory device according to a first embodiment. FIG. 2 illustrates a hardware configuration of the memory device. A memory device (semiconductor memory device) 1 is configured to communicate with a host device 2, which may be referred to as a host 2 hereinafter, as shown in FIG. 2. The memory device 1 and the host 2 communicate through a communication scheme which at least allows the memory device 1 to specify a size and a segment of write data in response to a write request from the host 2. Particularly, the memory device 1 and the host 2 communicate in accordance with the client/server model. The memory device 1 serves as a target and the host 2 as an initiator. More particularly, the memory device 1 may be a UFS memory device, and the host 2 may be a host which supports the UFS memory device.

The memory device 1 includes at least a nonvolatile semiconductor memory 11 and a memory controller 12 for controlling the memory 11. The memory 11 writes or reads data in write units each having a specific number of bits. The memory 11 also erases data in erasure units each having a specific number of write units.

Particularly, the memory 11 may include one or more NAND flash memories. In a case for the memory 11 being the NAND flash memory, the memory 11 writes or reads data in units of pages. As shown in FIG. 3, one page includes memory space formed by a group of mutually-coupled memory cells, and is assigned a unique physical address. Each memory cell includes a metal oxide semiconductor field-effect transistor (MOSFET) MT with a so-called stacked gate structure. Each cell transistor MT has varying threshold voltages according to the number of electrons stored in a floating gate electrode FG, and stores information according to the threshold voltage. The cell transistors MT have their respective current paths (source/drain SD) serially-connected to form a NAND string, and select transistors S1 and S2 are coupled to one NAND string's both ends. The other end of the current path of the select transistor S2 is coupled to a bit line BL, and the other end of the current path of the select transistor S1 is coupled to a source line SL.

The word lines WL0 to WL63 extend in the WL direction, and are coupled to the control gate electrode CG of each cell transistor MT in the same row. The cell transistor MT is provided at each intersection between the bit lines BL and the word lines WL. The select gate line SGD extends in the WL direction, and is coupled to all select transistors S2 in one block. The select gate line SGS extends in the WL direction, and is coupled to all select transistors S1 in one block. Memory cell transistors MT coupled to the same word line WL form one page.

For a case of the memory 11 being the NAND flash memory, each cell transistor MT can take multiple threshold voltages, that is, the memory 11 can be configured to store multiple levels (multiple bits) in one memory cell. For such a memory which can store multiple levels in a cell, two or more pages are assigned to one word line.

As shown in FIG. 4, the memory 11 includes a memory cell array 91 of memory cells, and a page buffer 92, which outputs and inputs data to and from memory cells. The page buffer 92 buffers data of one-page size. For writing data to the memory 11, the memory controller 12 transmits to the memory 11 a write command as well as write data of one-page size and a page address to which the data will be written. The memory 11 buffers the write data received from the memory controller 12 in the page buffer 92 and writes the buffered data to the memory cells specified by the page address. Upon the start of writing to the memory cells, the memory 11 outputs a busy signal to the memory controller 12 to indicate that it is in operation. For further writing, after the busy signal turns into a ready signal, the same operation as described above is repeated for one or more subsequent page addresses.

For reading data from the memory 11, the memory controller 12 transmits to the memory 11 a read command as well as a page address from which the data will be read. The memory 11 reads the data of one-page size from the memory cells specified by the page address to the page buffer 92. Upon the start of reading from the memory cells, the memory 11 outputs the busy signal to the memory controller 12. After the busy signal turns into the ready signal, the read data buffered in the page buffer 92 is output to the memory controller 11. For further reading, the same operation as described above is repeated for one or more subsequent page addresses.

For a case of the memory 11 being the NAND flash memory, the memory 11 erases data in units of blocks. Each block includes pages which have sequential physical addresses. The following description assumes that a write unit is a page and an erasure unit is a block for the purpose of convenience; however, the memory 11 is not necessarily limited to the NAND flash memory.

Referring back to FIG. 2, the memory device 1 includes an I/O 21, a core logic unit 22, and an I/O 23. The I/O 21 includes a hardware configuration to allow the memory device 1 to be coupled to the host 2. For a case of the memory device 1 being a UFS memory device, signals transmitted between the memory device 1 and the host 2 include RESET, REF_CLK, DOUT, DOUT_c, DIN, DIN_c, VCC, VCCQ, VCCQ2, VDDi, VDDi2 and VDDi3. RESET, REF_CLK, DOUT, DOUT_c, DIN and DIN_c are communicated between the host 2 and I/O 21. RESET is a hardware reset signal. REF_CLK is a reference clock. DOUT and DOUT_c form a differential signal pair and are transmitted to the memory device 1 from the host 2. DIN and DIN_c form a differential signal pair and are transmitted to the host 2 from the memory device 1. VCC, VCCQ, and VCCQ2 are voltages supplied to the memory 11 and the core logic unit 22. VDDi, VDDi2, and VDDi3 are supplied to the core logic unit 22, and are input terminals for application which includes a voltage regulator in the core logic unit 22.

The core logic unit 22 is the main part of the memory controllers 12 except the I/O 23. The I/O 23 includes a hardware configuration to allow the memory controller 12 to be coupled to the memory 11. The core logic unit 22 includes a host interface 31, a buffer 32, a data bus 33, a memory interface 34, a buffer 35, an error correction code (ECC) circuit 36, a control bus 41, a central processing unit (CPU) 42, a read only memory (ROM) 43, a work random access memory (RAM) 45, and a register 46.

The I/O 21 is coupled to the host interface 31. The host interface 31 performs processing for the memory device 1 and the host 2 to communicate. Specifically, the host interface 31 is responsible for communication between the memory device 1 and the host 2 in accordance with a communications protocol with which both the memory device 1 and the host 2 comply. For a case of the memory device 1 being a UFS memory device, the host interface 31 is the UFS interface, for example. The UFS interface complies with the M-PHY standard for the physical layer, and the UniPro standard for the link layer.

The host interface 31 is coupled to the buffer 32. The buffer 32 receives data transmitted to the memory device 1 from the host 2 through the host interface 31, and buffers it. The buffer 32 also buffers data to be transmitted to the host 2 through the host interface 31 from the memory device 1. The buffer 32 is coupled to the data bus 33.

The I/O 23 is coupled to the memory interface 34. The memory interface 34 performs processing for the memory controller 12 to communicate with the memory 11. Specifically, the memory interface 34 transmits instructions received from the core logic section 22 in a form recognizable by the memory 11. For a case of the memory 11 being the NAND flash memory, the memory interface 34 is a NAND flash interface.

The memory interface 34 is coupled to the buffer 35. The buffer 35 receives data transmitted to the memory controller 12 from the memory 11 through the memory interface 34, and buffers it. The buffer 35 also buffers data to be transmitted to the memory 11 through the memory interface 34 from the memory controller 12. The buffer 35 is coupled to the data bus 33. The memory interface 34 and the buffer 35 are coupled to the ECC circuit 36. The ECC circuit 36 is also coupled to the data buffer 35. The ECC circuit 36 receives the write data from the host 2 through the data bus 33, adds an error correction code to the write data, and provides the buffer 35 with the write data with the error correction code. The ECC circuit 36 also receives data from the memory 11 through the buffer 35, and uses the error correction code to error-correct the received data, and provides the data bus 33 with the error-corrected data.

The CPU 42, ROM 43, RAM 45, and register 46 are coupled to the control bus 41. The CPU 42, ROM 43, RAM 45, and register 46 communicate through the control bus 41. The CPU 42 manages the whole operation of the memory device 1. The CPU 42 performs processing based on the control program (commands) stored in the ROM 43. The CPU 42 performs processing for the memory 11 in accordance with commands received from the host 2 based on the control program.

The ROM 43 stores the control program executed by CPU 42, for example. The RAM 45 is used as a work area for the CPU 42 and temporarily stores variables for the CPU 42, for example. The register 46 stores various values for operation of the memory device 1. The register 46 also stores various values for the host 2 to control the memory device 1.

The host interface 31, buffer 32, memory interface 34, and buffer 35 are coupled to the control bus 41. The CPU 42 controls the host interface 31, buffer 32, memory interface 34, and buffer 35 based on the control program and the instructions from the host 2. An analog circuit 51 may be provided in the memory controller 12.

The memory device 1 may be an embedded type with which it is mounted on a printed circuit board with solder, or a removable type with which it is removable from a card slot in the host 2. FIG. 5 illustrates an example of the memory device 1 in a sealed form. One or more memories 11 each in chip form are mounted on a printed circuit board 201 as shown in FIG. 5. Memories 11 are coupled to a circuit pattern (not shown) on the printed circuit board 201 by wires 202. A memory controller 12 in chip form is also placed on the printed circuit board 201, and is coupled to the circuit pattern by the wires 202. External terminals (not shown) such as a ball grid array (BGA) are provided on the back of the printed circuit board 201. The signals shown in FIG. 2, i.e., RESET, REF_CLK, DOUT, DOUT_c, DIN, DIN_c, VCC, VCCQ, VCCQ2, VDDi, VDDi2, VDDi3 are assigned to the external terminals, through which assigned signals are communicated with the host 2 outside the memory device 1. The printed circuit board 201, memory 11, memory controller 12, and wires 202 are sealed by a package 203 made of resin, for example.

Referring to FIG. 6, another aspect of a configuration of the memory device 1 is illustrated. Specifically, FIG. 6 illustrates a logical configuration of the memory device 1, i.e., functional blocks thereof. Each functional block may be implemented as hardware, computer software, or combination of the both. Whether each functional block is implemented as hardware or software depends on the particular application and design constraints imposed on the overall system. Those skilled in the art may implement the functional blocks in varying ways for each particular application, but any implementation approach is included in the scope of the embodiment. Moreover, it is not essential that each functional block is distinguished like the following examples. For example, some functions may be performed by a functional block other than the functional block illustrated in the following description. Illustrated blocks may be divided into smaller functional subblock. The embodiment is not limited by which block assumes a particular function.

Figures 7, 8:
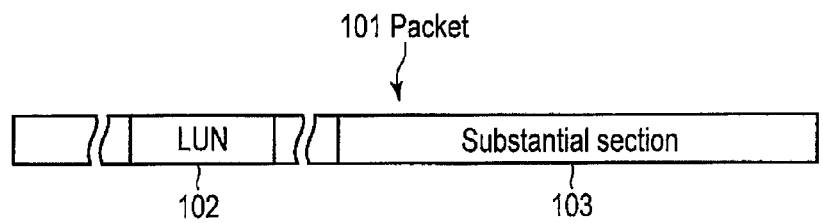
FIG. 7 illustrates an example of a packet.
FIG. 8 illustrates an example of a table for translating logical addresses and physical blocks.

The memory device 1 includes a target port 61, a router 62, a device manager 63, descriptors 64, attributes 65, flags 66, and two or more logical units (LUs) 67. The target port 61 is a port for the memory device 1 to be communicatively coupled to the host 2 and corresponds to the host interface 31, for example. The router 62 routes a communication such as a task, a command, data, or a query received from the host 2 to an addressed LU 67. The host 2 requests processing specified by a command or task management function through a request with one LU 67 addressed. The LUs 67 can be identified by addresses such as logical unit number (LUN). The LUN can be included in the communication (packet) transmitted and received between the memory device 1 and the host 2 as shown in FIG. 7. A packet 101 includes the LUN 102 and a substantial section 103 as shown in FIG. 7. The LUN 102 can be included in a header of the packet 101, for example. The substantial section 103 includes unique contents based on a function of the packet, such as a command, data, various kinds of parameters. The LU 67 addressed by each packet is identified by the LUN therein. For the UFS memory device, each packet transmitted and received between the memory device 1 and the host 2 includes the header, which contains the LUN.

The router 62 routes the communication such as a task, a command, data, or query received from the host 2 to the addressed LU 67 based on the LUN in this communication. The router 62 transmits the communications destined to the host 2 and received from LUs 67 to the target port 61 in a suitable order based on the time sharing, for example. The router 62 may be implemented by the CPU 42, R0M 43, and register 46. Specifically, it may be implemented by the program in the ROM 43 executed by the CPU 42 with values in the register 46 referred.

The device manager 63 manages device-level operation and configuration. The device-level management may include control of power and sleep of memory device 1. The device-level configuration may include holding of a set of descriptors. The device manager 63 process a command such as a query request from the host 2, which requests update and output of configuration information of the memory device 1. The device manager 63 may be implemented by the CPU 42, ROM 43, and register 46. Specifically, it may be implemented by the program in the ROM 43 executed by the CPU 42 with values in the register 46 referred.

The descriptors 64, attributes 65, and flags 66 may be implemented as data in the work RAM 45. The descriptors 64 have the data structure in a defined format, and are for describing one or more features of the memory device 1. The descriptors 64 may include a device class, a subclass, a protocol necessary for the memory device to be accessed. The attributes 65 are configurable or read-only parameters and describe settings given to the memory device 1. The attributes 65 may include the possible largest size of data which can be transmitted and received between the memory device 1 and the host 2. The flags 66 may include alternative logical values for various items, and each may represent "true" or "false", or "1" or "0".

Each LU 67 may be implemented by the memory 11, memory interface 34, buffer 35, ECC circuit 36, CPU 42, ROM 43, and register 46. Each LU 67 independently performs processing requested by the host 2. Each LU 67 is implemented by part of resources provided by the memory 11, interfaces 21 and 23, buffer 35, ECC circuit 36, CPU 42, ROM 43, and register 46. LUs are distinguished one from another by the host 2 as described above by the LUN identifying one LU. The command from the host 2 is executed by the specified LU 67.

Each LU 67 includes a device server 71, a task manager 72, and memory area 73. The memory area 73 includes part of the memory area of the memory 11, and actually stores write data received from the host 2. The device server 71 and task manager 72 may be implemented by the CPU 42, ROM 43, and register 46. Specifically, it may be implemented by the program in ROM 43 executed by the CPU 42 with values in the register 46 referred. The device server 71 interprets and performs a command which requests LU-level processing received from the host 2. Such processing may include writing, reading, or easing data. Since LUs 67 include respective memory areas 73, the device server 71 can has at least a function to control the memory area 73 (memory 11). The task manager 72 controls an order of execution of commands (, or tasks) and offers task management.

As described above, the device server 71 performs processing for control the memory 11. Such processing may include translation of a logical address and a physical address. A logical address is assigned by the host 2 to data which the host 2 requests to write to the memory device 1. A physical address is for identifying a write area (or page) or an erasure area (or block) in the memory 11 as described above. The device server 71 manages a state of data stored in its memory area 73. The management of the memory state includes managing a correspondence between a page (, or a physical block) of a physical address and the logical address of the data stored in this page, and managing which physical address page (, or physical block) is erased (, or stores no or invalid data). For such management, the device server 71 may store a table for translating between logical addresses and physical addresses (hereinafter referred to as a translation table).

As an example of the translation, blocks may be used for assignment as shown in FIG. 8. A fixed logical address offset is assigned to each page in each block. FIG. 8 illustrates an example of a logical address assigned to each 512 B-size data-item with write-unit size of the memory 11 being 16 KB.

Figure 9:
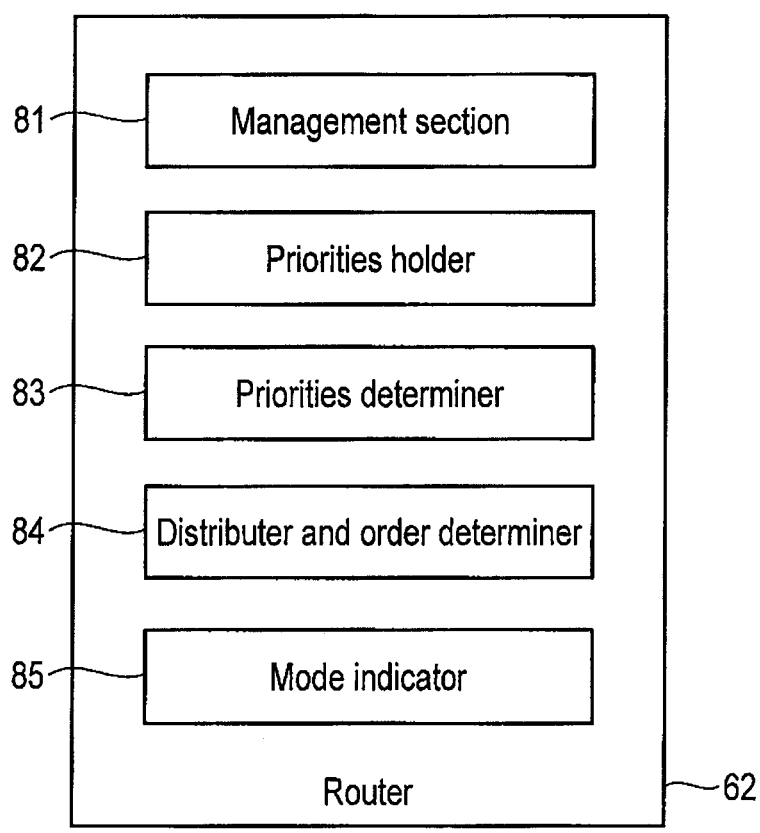
FIG. 9 illustrates functional blocks of a router according to the first embodiment in detail.

Referring to FIGS. 9 and 10, writing will now be described. FIG. 9 illustrates functional blocks in the router 62 according to the first embodiment in detail. FIG. 10 illustrates communications during writing according to the first embodiment. The router 62 includes a management section 81, a priorities holder 82, a priorities determiner 83, a distributer and order determiner 84, and a mode indicator 85 as shown in FIG. 9.

The management section 81 manages the whole router 62. The priorities holder 82 stores information indicative of priorities if priorities among the LUs 67 are defined. A user of the memory device 1 can define the priorities through the host device 2, for example. The priorities holder 82 may be implemented by the RAM 44 and/or register 46. The priorities determiner 83 accesses the priorities holder 82 to determine the priorities among LUs 67 targeted by respective write commands. The distributer and order determiner 84 distributes received communications to the addressed LUs 67 referring to the addresses included therein. The distributer and order determiner 84 also transmits communications addressed to the host 2 and received from the LUs 67 to the target port 61 in a determined suitable order by time sharing, for example. Specifically, the distributer and order determiner 84 determines the order based on the information from the priorities determiner 83. The mode indicator 85 will be described later.

The memory device 1 is configured to accept a command requesting access to a LU 67 before completion of processing of another command requesting access such as writing, reading, or erasure to another LU 67. Specifically, parallel access to LUs 67 is possible through the above-mentioned function of the router 62.

Referring to FIG. 10, a sequence in writing will now be described. The following describes a context of parallel access to two LUs 67$_1$ and 67$_2$. The context also assumes that no priorities are defined between the two LUs 67$_1$ and 67$_2$. A case with priorities will be described in a second embodiment.

As shown in FIG. 10, the first write command is transmitted to the memory device 1 from the host 2. A write command includes a LUN, a write instruction, an address, and a size of data to be written. The address specifies the position (or the logical address) where the write data will be written. The write-data size indicates the size of the whole write-data. The first write command specifies the LU 67$_1$ as its address, for example.

Generally, data, commands, queries are carried in a packet in the UFS memory system. For a case of the memory device 1 and the host 2 being a part of the UFS memory system, a write command is a command transmission packet, or Command UFS Protocol Information Unit (UPIU). A packet contains a header, and a substantial section of a packet contains a command description section, which carries a command based on the Small Computer System Interface (SCSI) standard. The SCSI command contains a write command, an address, and the size of data to be written.

The first write command is received by the device server 71 of the addressed LU 67$_1$ through distribution by the router 62. The device server 71 generates a request for transmitting a segment of the write data (a write-data segment). The transmission request requests the write-data segment of a size determined so that the end of the segment written in a page aligns with the end of the page. For a case of a write request corresponding to writing from the head of a page, a write-data segment has the size of a page. As described, the device server 71 requests data segments of the page size because the memory 11 is supposed to write data in units of pages, and it can write data efficiently when it receives write-data segments of the page size.

Note that in the current context the logical address is 0x0000, which corresponds to a write request from the head of a block (i.e., the head of a page). For this reason, the first transmission request 1-1 requests the segment from the head of the write data. Specifically, the transmission requests of the write-data segment of size 16 KB and logical address 0x0000 is generated. The transmission request 1-1 is routed to the host 2 by the router 62 as shown in FIG. 10. Note that if a write request does not request writing of data from the head of a page, the device server 71 requests the segment from the head of the write data which will fit to the end of a page as the first write-data segment, and then it requests the subsequent write-data segments of the page size.

A transmission requests contains a LUN (header), a transmission data address, and a transmission data size. The transmission data address specifies the offset address of the write-data segment which the LU 67 requests to be transmitted. The transmission data size indicates the size of the corresponding write-data segment. For a case of the memory device 1 and the host 2 being part of the UFS memory system, the transmission request is a transmission request packet, or Ready To Transfer UPIU. The transmission request packet indicates that the LU 67 is ready for data transmission and contains the transmission data address and the transmission data size in the substantial section of the packet.

Upon reception of the transmission request, the host 2 transmits the requested write-data segment as shown in FIG. 10. The data transmission contains the LUN (i.e., the header) and data. For a case of the memory device 1 and the host 2 being part of the UFS memory system, the write-data segment is carried by a host data transmission packet, or Data Out UPIU. The host data transmission packet contains the write-data segment to be transmitted in the substantial section.

The write-data segment from the host 2 is received by the first LU $67_1$, which has issued the corresponding transmission request (data transmission 1-1). The received write-data segment is written to a suitable part of the memory area 73 by control of the device server 71.

The device server 71 of the first LU $67_1$ then generates a subsequent transmission request 1-2. The transmission request 1-2 requests transmission of the page-size segment subsequent to the first write-data segment of the write data. The second write-data segment has logical address 0x0020 and size 16 KB. The transmission request is transmitted to the host 2 (data transmission 1-2). The corresponding data segment is then written to the memory area 73 through the steps as described with reference to the first data-segment.

Here, suppose that before the writing to the first LU $67_1$ by the first write command is completed, a second write command requesting writing to the second LU $67_2$ is issued. The timing of issue of the second write command is not limited to that illustrated in FIG. 10.

The second write command requests writing of data of the logical address 0x1000 and size 32 KB, for example. When the router 62 receives the second write command before completion of the writing by the first write command, it does not refuse the second command but process it. Specifically, the router 62 processes the two requests (the first and second write commands) based on the following principles.

No priorities are defined between LUs 67 in the present embodiment as described above. Specifically, no priorities are defined at least between the first LU $67_1$ targeted by the uncompleted first write-command and the second LU $67_2$ targeted by the newly received second write-command. The information on such priorities are stored in the priorities holder 82. The priorities determiner 83 accesses the priorities holder 82 to acquire the information on the priorities. The priorities determiner 83 then learns that no priorities are defined between the first and second LUs $67_1$ and $67_2$ and notifies the distributer and order determiner 84 of this. The distributer and order determiner 84 processes uncompleted access requests (writing, in the current context) to two or more LUs 67 in parallel if no priorities are defined between LUs 67 targeted by these requests. Specifically, it uses a transmission request and corresponding data transmission as one set to execute processing for two or more write requests based on the time sharing for such sets. Specifically, it executes uncompleted sets of processing for LUs 67 one LU by one LU in turn. For example for parallel processing requests to LUs 67 as in the current context, the distributer and order determiner 84 serves for the first LU $67_1$, second LU $67_2$, first LU $67_1$, and second LU $67_2$ . . . in turn. The principles apply to parallel processing requests to three or more LUs 67.

The distributer and order determiner 84 transmits the received second write command to the addressed second LU $67_2$. Upon reception of the second write command, the device server 71 of the second LU $67_2$ generates a transmission request. Generation of the transmission request is the same as that described for the first write command above. In the current context, the transmission request 2-1 of the write-data segment of logical address 0x1000 and size 16 KB is generated. The transmission request 2-1 is received by the distributer and order determiner 84, and then transmitted to the host 2. The distributer and order determiner 84 receives a corresponding data segment from the host 2 and transmits it to the second LU $67_2$ (data transmission 2-1). The device server 71 of the second LU $67_2$ writes the received data to the memory area 73 of the second LU $67_2$ with the steps as described above for the first data segment.

While processing for the second LU $67_1$ is being executed, the processing for the first LU $67_1$ is suspended. For example, when the distributer and order determiner 84 receives a transmission request from the first LU $67_1$, it does not transmit but temporarily buffers it. As one actual example embodiment, when the configuration in FIG. 6 is implemented by software, the software, upon reception of the second write command, executes the processing for the second LU $67_2$ and generates the transmission request for the first LU $67_1$ after completion of the first processing (transmission request and data transmission) for the second LU $67_2$.

After completion of the data transmission 2-1 for the second LU $67_2$, the distributer and order determiner 84 transmits a transmission request 1-3 received from the first LU $67_1$ to the host 2. The data segment corresponding to the transmission request 1-3 is written to the first LU $67_1$ (data transmission 1-3).

The similar processing is then repeated. Specifically, the processing for first LU $67_1$, the processing for second LU $67_2$, the processing for first LU $67_1$ . . . is repeated. In each processing, one transmission request requests a data transmission of page size from the end of the precedent data segment for the same LU 67. Upon completion of the processing for the request (write request) for a LU 67, the device server 71 of the corresponding LU 67 transmits to the host 2 a response indicative of successful writing. FIG. 10 illustrates an example in which the processing for the second write command is completed after two sets of transmission request and data transmission. After issue of responses indicative of success for all requests, the processing finishes.

In the description so far, processing for one of LUs 67 is executed one by one in turn. However, two or more turn for one LU 67 may succeed. Furthermore, order of turn may vary for every round. For example, the first LU, second LU, and third LU are served in the mentioned order in the first round, and the first LU, third LU, and second LU in the second round. In other words, with each data transmission being the same size, the processing is handled equally among LUs while the processing requests for two or more LUs coexist. The specific implementation of such equal handling can be realized variously as described herein or in any possible methods.

Figure 11:
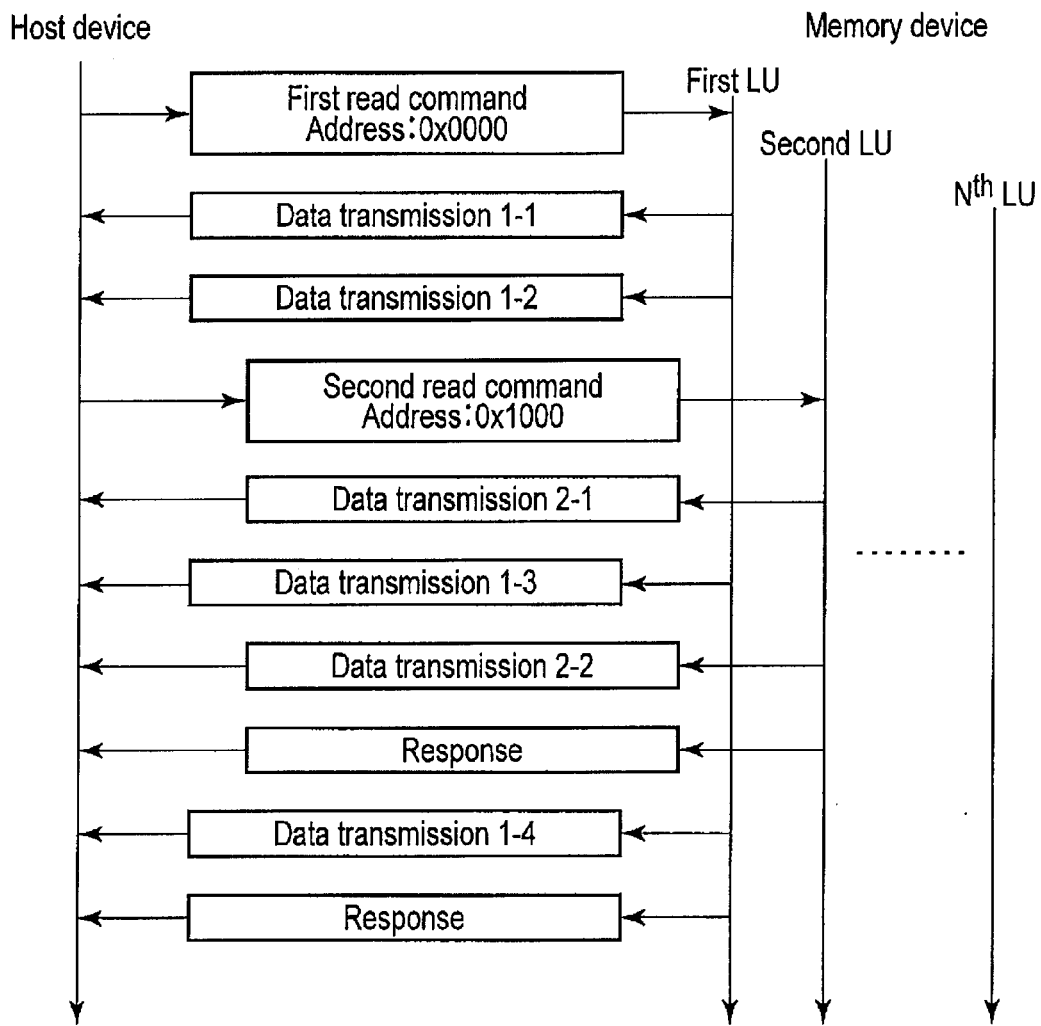
FIG. 11 illustrates communications during reading according to the first embodiment.

General principles for reading are the same as those for writing. FIG. 11 illustrates communication during reading according to the first embodiment. The host 2, which requires reading issues a read command to the memory device 1 instead of the write command in FIG. 10. Each read command includes at least a logical address of LUN, a read instruction, and read data. For reading, upon reception of the read command, the LU 67 transmits segments of whole requested data of appropriate size one after another. For a case of the memory device 1 and the host 2 forming the UFS memory systems, the read-data segment is carried in a device data transmission packet, or Data Out UPIU. The device data forward packet contains the read-data segment to be transmitted in a substantial section. The router 62 transmits read-data segments to the host 2. While processing for the requests for two or more LUs 67 are under execution in parallel, processing for each LU 67 is handled equally as in writing. From the reception of the second read command, data transmission from the LU $67_1$ and that from LU $67_2$ are executed in turn in an example of the figure. Upon completion of transmission of the whole read data for a read command, the corresponding LU 67 transmits a response indicative of a success to the host 2 via the router 62. Any description for reading other than those described above is the same as writing.

As described above, the memory device according to the first embodiment is configured to accept a command before completion of processing of another command. This applies to a case of three or more commands. Generalized description is that the device is configured to accept a command before completion of processing of one or more commands. In other words, it is configured to multi-access to two or more LUs. For uncompleted commands, the memory device divides the processing requested by the commands into two or more segments and executes one segment for one LU in turn. Thus, the parallel access to LUs is realized. For a case of the host supporting multitasking application in particular, the memory device which can improve the performance of parallel operation through multitasking application can be implemented.

The description so far is directed to an example of multi-access always permitted. In contrast, there can be a multi-access permission mode which permits the multi-access, and a multi-access prohibit mode which prohibits it. To this end, a mode indicator 85 can be provided in the router 62 as shown in FIG. 9. The mode indicator 85 may be implemented by the RAM 44 and/or the register 46. The mode indicator 85 holds information indicative of which mode the memory device 1 is in. A user of the memory device 1 can select the modes by setting it through the host device 2. Modes can be selected during the initial setting of the memory device 1, or at any other timing, for example. Upon reception of a command before completion of processing for another command, the management section 81 in the router 62 refers to the mode indicator 85 and notifies the distributer and order determiner 84 of the result. Then, if the multi-access is permitted, the distributer and order determiner 84 operates as described above. In contrast, if the multi-access is prohibited, the distributer and order determiner 84 refuses the late second command. Specifically, the router 62 may only ignore the second command. Alternatively, it notifies the host 2 of that a command during processing for another command is unacceptable. In this case, the host 2 reissues the second command to the memory device 1 after completion of processing for the earlier command. Coexistence of two modes can support a user who wishes processing to be completed in the order of initiation thereof.

Moreover, the ECC circuit 36 adds the error correction code to the write data as described above. Specifically, the ECC circuit 36 divides a received write-data segment into segments, which may be referred to as a substantial data segment, with a size determined based on details such as the nature of the ECC circuit 36. The ECC circuit 36 generates ECCs for respective substantial data segments, and adds them to respective substantial data segments. In other words, a substantial data segment is a unit used for ECC processing. A set of a substantial data segment, a corresponding ECC, and corresponding management data may be referred to as a frame. The frame is output from the ECC circuit 36. A particular device server 71 corresponding to the addressed LU associated with write data buffers frames received from the ECC circuit 36 in the buffer 35 based on a request to write data for the frames. Once a particular number of the frames is buffered in the buffer 35, a corresponding device server 71 writes the frames to a corresponding memory area 73.

The memory device 1 takes into consideration the sizes of one frame and various necessary management data to determine the size of the write-data segment. Specifically, memory device 1 requests possible largest write-data segment while smaller than the combined size of the write-data segment and corresponding all additional data (e.g., ECC, management data). FIG. 14 illustrates a format of the data in one page of the memory device 1 according to the first embodiment. The memory device 1 request the write-data segment of the size determined to allow it to have a format as shown in FIG. 14 when written to the page. As shown in FIG. 14, one frame consists of substantial data segments 301, corresponding management data items 302, and corresponding ECCs 303. FIG. 14 illustrates the substantial data segment 301 of 1024 bytes, management data 302 of 2 bytes, and ECC 303 of 76 bytes. Each page may need to contain management data 306, to which its ECC 307 may be added. The management data 306 and ECC 307 may have 8 bytes and 76 bytes in size, respectively. The memory device 1 requests the write-data segment of the size determined to allow the remaining unused portion 308 of the page without the substantial data segments 301 of the write-data segment and first additional data (e.g., the ECCs 303 and 307 and management data 302 and 306) to be smaller than the combined size of one substantial data segment 301 and second additional data (e.g., the ECC 303 and management data 302) for the substantial data segment 301. With the write-data segment of such a size, a page can be used most efficiently.

The applied ECC system uses its own fixed size of the ECC processing unit, which corresponds to the size of the substantial data segment 301. Similarly, the sizes of the management data 302, ECC 303, and management data 307 are also fixed. Therefore, one page can contain the fixed maximum number of the substantial data segments 301 determined based on the size of the ECC processing unit.

(Second Embodiment)

In the first embodiment, requests for two or more LUs 67 are equally executed among the LUs 67. In the second embodiment, requests for the LUs 67 are unequally executed among the LUs 67. A memory device according to the second embodiment has the same hardware configuration (see, FIG. 2) as the first embodiment, and functional blocks (see, FIG. 6). In the following, referring to FIG. 11, features for write sequence different from those of the first embodiment will be described. Note that all description for the first embodiment applies to features for the second embodiment not described below.

The initial part of processing of FIG. 11 is the same as that of the first embodiment (FIG. 10). Particularly, a first write command, a transmission request 1-1, data transmission 1-1, a transmission request 1-2, and data transmission 1-2 occur as in the first embodiment.

The memory device 1 receives a second write command before completion of the writing to the first LU $67_1$ by the first write command. The following description assumes that the memory device 1 is in multi-access permission mode. The second write command requests writing of data of logical address 0x1000 and size 32 KB, for example. Upon reception of the second write command before completion of the writing by the first write command, the router 62 does not refuse but processes it. Specifically, the router 62 processes more than one requests (the first and second write commands) based on the following principles.

The priorities determiner 83 accesses the priorities holder 82 to acquire the information on the priorities. Suppose that the second LU $67_2$ has a priority higher than the first LU $67_1$ as an example. The priorities determiner 83 learns that the second LU $67_2$ has the higher priority and notifies the distributer and order determiner 84 of it. The distributer and order determiner 84 intensively performs processing for the LU 67 with top priority to complete them. In the current context, the device server 71 of the second LU $67_2$ transmits a transmission request 2-1 received from the second LU $67_2$ following the second write command, receives a corresponding data segment, and writes it to the memory area 73 of the second LU $67_2$. The memory device 2 continues the processing for the second LU $67_2$. Particularly, the device server 71 of the second LU $67_2$ transmits a transmission request 2-2, receives a corresponding data segment, and writes to the memory area 73 of the second LU $67_2$. The processing of the second write command is now completed, and then the device server 71 of the second LU $67_2$ transmits a response indicative of successful writing to the host 2.

While the processing for the second LU $67_2$ is advancing, the processing for the first LU $67_1$ is suspended. For example, when the distributer and order, determiner 84 receives a transmission request from the first LU $67_1$, it does not transmit but temporarily stores it. As an example of an actual embodiment, when the configuration of FIG. 6 is implemented by software, the software resumes the processing for the first LU $67_1$ after completion of the processing for the second LU $67_2$.

The processing for the first LU $67_1$ then resumes and continues until its completion.

Parallel processing for three or more LUs are also performed based on the above-mentioned principles. Particularly, upon reception of a new request during a parallel processing for two or more requests, the priorities determiner 83 compares the priorities among LUs 67 targeted by the earlier requests and the LU 67 targeted by the latest request. In fact, if the priorities are defined for all the LUs 67, it is sufficient that the LUs with the currently-highest priority is compared with the LU 67 targeted by the latest request. Then, the processing for the LU 67 with the highest priority is executed through interruption. Upon completion of the interrupting processing, the processing for the LU 67 with the highest priority among the remaining requests is executed. In this way, the processing continues until all requests are completed. The second embodiment may be combined with the first embodiment. Particularly, while processing for two LUs with the same priority are being executed as in the first embodiment and when a request for another LU with a higher priority is received, the processing for the latest request is executed with top priority. After completion of the latest request, processing for the two earlier LUs continue as in the first embodiment.

In the description so far, processing for the LU 67 with the highest priority continues until its completion. However, the LUs 67 can be weighted based on their priorities, and the processing for the LUs 67 can be unequally handled, for example. Particularly, processing for a LU and much processing (two turns, for example) for another LU form a set, and such a set is repeated. The LU which enjoys two turns of processing in one set in such a context has a priority higher than other LUs which receives only one turn.

Figure 12:
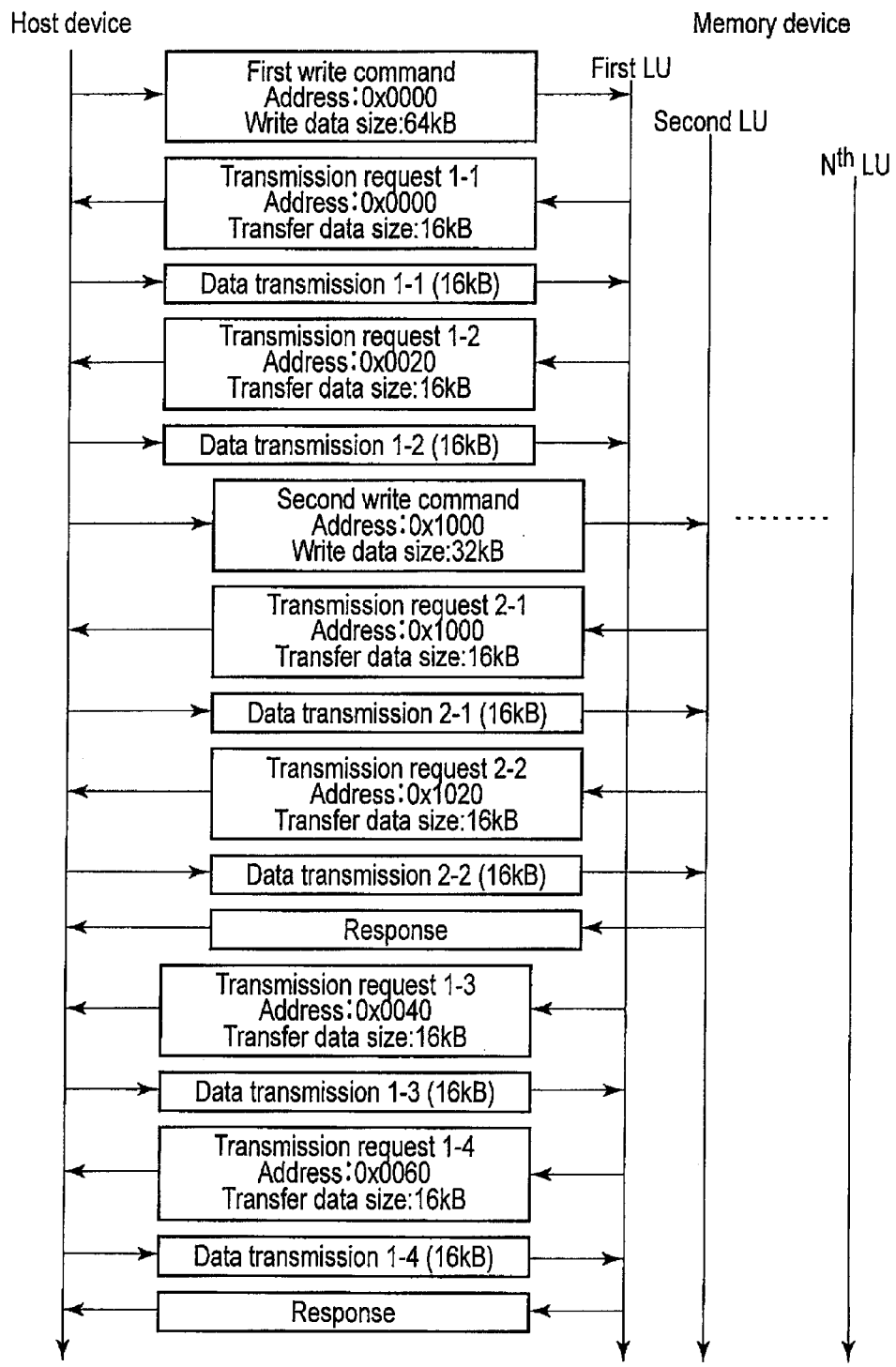
FIG. 12 illustrates communications during writing according to a second embodiment.
Figure 13:
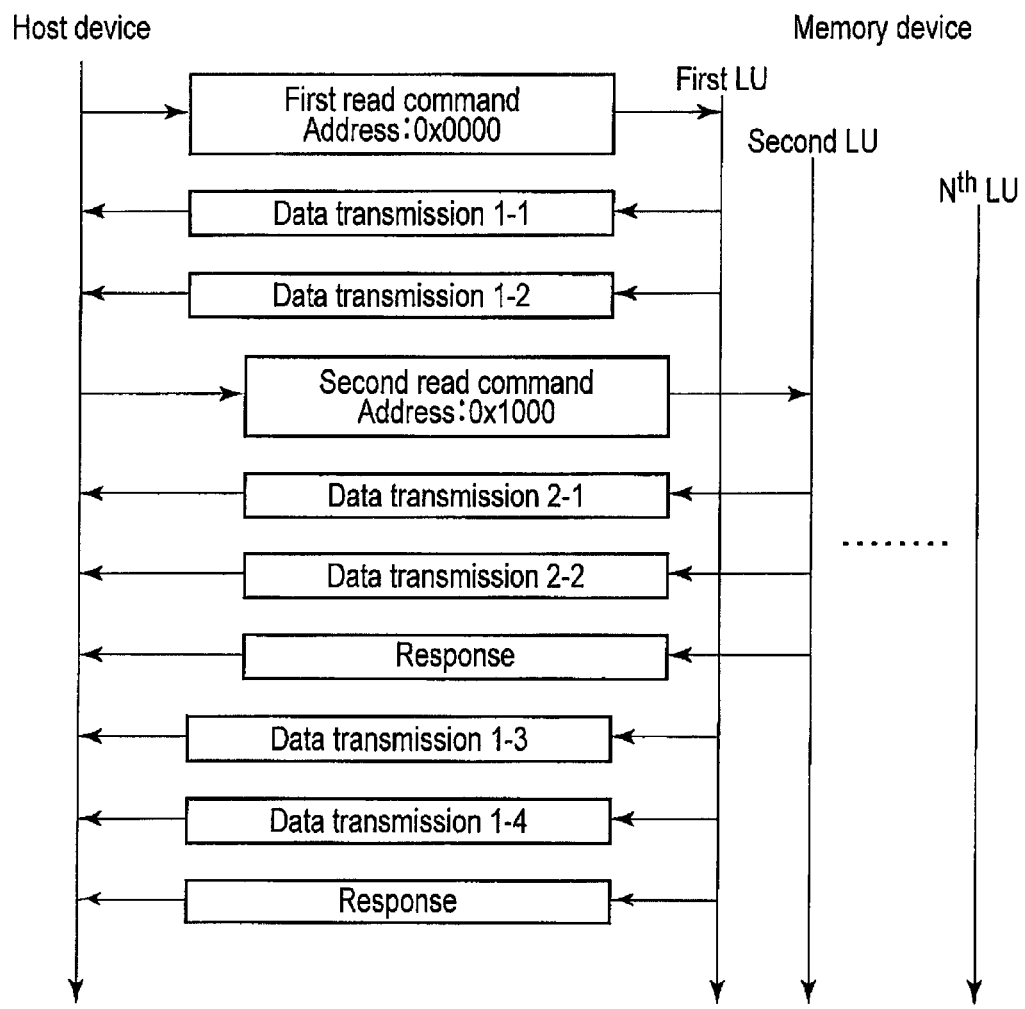
FIG. 13 illustrates communications during reading according to the second embodiment.

The description so far is directed to writing. The present embodiment can, however, also be applied to reading as in the first embodiment. FIG. 12 illustrates communications during reading according to the second embodiment. The memory device 1 receives a read command before completion of the processing for another read command. Then, the memory device 1 first completes the processing for the latest read command. The memory device 1 then resumes the processing for the earlier read command. Features for reading other than those described so far are the same as those for writing.

As described above, the memory device according to the second embodiment is configured to accept another command before completion of the processing of one or more other commands as in the first embodiment. Whenever the memory device 1 receives a new command, it preferentially executes processing for the LU with the highest priority based on the priorities of the LUs targeted by all received commands, for example. Such preferential processing may be extensive processing for the highest-priority LU or parallel handling with much processing for the highest-priority LU. Thus, parallel access to LUs is realized.

Also in the second embodiment, the write-data segment may have size determined to allow the combined size of the write-data segment and all corresponding additional data (ECC, management data) to be the largest while smaller than the page as in the first embodiment. Moreover, the write-data segment which the memory device 1 requests the host 2 to transmit has a size equal to one page of the memory 11 in embodiments as described above; however, the size of the write-data segment may be an integral multiple of the page size. The same applies to the case with the additional data considered. Particularly, the write-data segment may have a size of an integral multiple of the possible largest combined size of the write-data segment and all corresponding additional data (ECC, management data) while smaller than the page.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a nonvolatile memory which stores data in units of a write unit comprising cells; and
a controller which
controls the nonvolatile memory,
partitions memory space of the nonvolatile memory,
in response to a request to write write-data to the nonvolatile memory from a host device, requests the host device to transmit a segment of the write-data with a specified size, wherein the write-data segment has a size determined to allow for a size of a set of part of the write-data segment and corresponding additional data to be the largest while smaller than a size of the write unit, and wherein a size of the part of the write-data segment is a division by an integer of the size of the write-data segment, and before completion of processing a first command which requests access to a first partition, accepts a second command which requests access to a second partition.

2. The device of claim 1, wherein
the controller executes parts of processing requested by the first command and parts of processing requested by the second command in turn when it receives the second command before processing of the first command is completed.

3. The device of claim 2, wherein
when the controller receives, before completion of processing requested by one or more preceding commands requesting access to one or more partitions, a succeeding command requesting access to another partition,
the controller executes parts of processing requested by each of the one or more preceding commands and parts of processing requested by the succeeding command in turn equally for each of the one or more preceding commands and the succeeding command.

4. The device of claim 1, wherein
when the controller receives the second command before processing of the first command is completed, the controller suspends processing requested by one of the first and second commands which requests access to one of the first and second partitions with a lower priority and completes processing requested by the other one of the first and second commands.

5. The device of claim 1, wherein
the controller takes one of a first mode and a second mode,
the controller in the first mode accepts a command requesting access to the second partition before completion of processing requested by another command requesting access to the first partition, and
the controller in the second mode refuses a command requesting access to the second partition before completion of processing requested by another command requesting access to the first partition.

6. The device of claim 1, wherein
the additional data comprises at least one of management data for a corresponding write-data segment and an error correcting code.

7. The device of claim 6, wherein
the controller comprises an error correcting code circuit which generates the error correcting code, and
the error correcting code circuit generates error correcting codes in units of a correction unit which is a segment of received data.

8. The device of claim 7, wherein
a remaining portion of the write unit without a set of the write-data segment and corresponding additional data is smaller than a size of a set of the correction unit and additional data for the correction unit.

9. The device of claim 1, wherein
the write-data segment has a size determined to allow for a set of the write-data segment and corresponding additional data to be the largest while smaller than the write unit.

10. The device of claim 1, wherein
the memory device comprises a universal flash storage memory device.

11. The device of claim 1, wherein
the memory device comprises a first logical unit and a second logical unit which comprises respective portions of function of the controller and respective portions of the memory space, and
the first and second logical units write data to the respective portions of the memory space and transmit respective requests to transmit the write-data segment, separately.

12. A memory device comprising:
a nonvolatile memory which stores data in units of a write unit comprising cells; and
a controller which
controls the nonvolatile memory,
partitions memory space of the nonvolatile memory,
in response to a request to write write-data to the nonvolatile memory from a host device, requests the host device to transmit a segment of the write-data with a specified size, wherein the write-data segment has a size to allow the write-data segment to be written in a write unit to fit the end of the write unit, and
before completion of processing a first command which requests access to a first partition, accepts a second command which requests access to a second partition.

13. The device of claim 12, wherein
the controller executes parts of processing requested by the first command and parts of processing requested by the second command in turn when it receives the second command before processing of the first command is completed.

14. The device of claim 13, wherein
when the controller receives, before completion of processing requested by one or more preceding commands requesting access to one or more partitions, a succeeding command requesting access to another partition,
the controller executes parts of processing requested by each of the one or more preceding commands and parts of processing requested by the succeeding command in turn equally for each of the one or more preceding commands and the succeeding command.

15. The device of claim 12, wherein
when the controller receives the second command before processing of the first command is completed, the controller suspends processing requested by one of the first and second commands which requests access to one of the first and second partitions with a lower priority and completes processing requested by the other one of the first and second commands.

16. The device of claim 12, wherein
the controller takes one of a first mode and a second mode,
the controller in the first mode accepts a command requesting access to the second partition before completion of processing requested by another command requesting access to the first partition, and
the controller in the second mode refuses a command requesting access to the second partition before completion of processing requested by another command requesting access to the first partition.

* * * * *